US006516281B1

(12) United States Patent
Wellstood et al.

(10) Patent No.: US 6,516,281 B1
(45) Date of Patent: Feb. 4, 2003

(54) SCANNING SINGLE ELECTRON TRANSISTOR MICROSCOPE FOR IMAGING AMBIENT TEMPERATURE OBJECTS

(75) Inventors: Frederick C. Wellstood, Lanham, MD (US); Matthew Edward Kenyon, Hyattsville, MD (US); Christopher J. Lobb, Washington, DC (US)

(73) Assignee: University of Maryland, College Park, MD (US)

( * ) Notice: Subject to any disclaimer, the term of this patent is extended or adjusted under 35 U.S.C. 154(b) by 0 days.

(21) Appl. No.: 09/458,666

(22) Filed: Dec. 10, 1999

Related U.S. Application Data

(60) Provisional application No. 60/111,652, filed on Dec. 10, 1998.

(51) Int. Cl.[7] .............................................. G01R 33/035
(52) U.S. Cl. ........................ 702/130; 324/248; 324/250
(58) Field of Search .......................... 702/130; 324/248, 324/224, 226, 750; 250/201.3, 306, 330; 382/147

(56) References Cited

U.S. PATENT DOCUMENTS

| | | | |
|---|---|---|---|
| 5,491,411 A | 2/1996 | Wellstood et al. | .......... 324/248 |
| 5,894,220 A | 4/1999 | Wellstood et al. | .......... 324/248 |
| 5,900,618 A | 5/1999 | Anlage et al. | ........... 250/201.3 |

FOREIGN PATENT DOCUMENTS

WO    WO 97/29385    2/1997

OTHER PUBLICATIONS

"Scanning Single Electron Transistor Microscopy: Imaging Individual Charges," M.J. Yoo et al. *Science*, v. 276 pp. 579–582, Apr. 25, 1997.

"Scanning Single Electron Transistor Microscopy: Imaging Individual Charges," M.J. Yoo et al. International Conference on Solid State Devices and Materials, JA, Japan Society of Applied Physics, Sep. 1998, pp. 200–201.

"Non–contact VLSI imaging using a scanning potential microscope," R.J. Prance et al. Meas. Sci. Technol., v. 9 pp. 1229–1235, Sep. 1998.

*Primary Examiner*—Kamini Shah
(74) *Attorney, Agent, or Firm*—Rosenberg, Klein & Lee

(57)    ABSTRACT

A system, method, and computer program product are provided for scanning objects such as computer chips. A near-field scanning Single Electron Transistor (SET) is used to detect features of the object. In particular, the SET detects variations in an electric field surrounding or emanating from the object. The variation in the field may be associated with an irregularity in the object, such as an open in the circuitry of a chip. In the case of a chip or a multi-chip module, a voltage is applied to the line containing the suspected open. If an actual open is present, the open will be manifested in an irregularity in the electric field associated with the line. The SET detects the irregularity in the field. For the SET to operate, a sufficiently cold operating temperature is maintained for the SET. A very low (cryogenic) temperature allows the use of a larger, more sensitive SET. Scanning SETs are known in the literature, but in such systems the object to be scanned must also be at cryogenic temperatures. In the invention described herein, the object to be scanned can be left at a temperature in its normal environmental temperature range. This temperature range is referred to hereinafter as the ambient temperature range of the object. A chip, for example, typically operates in an ambient temperature range that includes room temperature. Data from the SET indicating irregularity in the electric field can be used to derive readout data, which can in turn be used to produce an image of the object scanned.

19 Claims, 7 Drawing Sheets

SCANNING SINGLE ELECTRON TRANSISTOR MICROSCOPE FOR IMAGING AMBIENT TEMPERATURE OBJECTS

CROSS-REFERENCE TO RELATED APPLICATION

This application claims the benefit of U.S. Provisional Application No. 60/111,652, filed Dec. 10, 1998 (incorporated in its entirety herein by reference).

BACKGROUND OF THE INVENTION

1. Field of the Invention

The invention described herein relates to imaging. In particular, the invention relates to sensing electric fields.

2. Related Art

The occurrence of wiring defects in computer chips and multi-chip modules is a serious manufacturing problem. Most types of circuit faults can be localized to more or less definite regions on a chip simply because they produce failures in specific sections of the circuit. If the precise location of a circuit defect could be determined, then the likely cause could be ascertained and changes could be made in the design or fabrication process to correct the problem and improve the yield.

The most common type of fault which manufacturers encounter in present day chips is an unintended electrical open. An open can arise for a variety of reasons. One type of open involves a failed connection at a connection between wires on different layers of a chip, also known as a via. This can happen when a hole is being etched through an insulating layer and the etch is not quite completed, leaving a thin insulating layer between the upper and lower wiring layers. This type of failure is more common for holes with a large ratio of depth to diameter; such holes tend to be used in high-density chips. Another type of failure involves electro migration, creating a void or constriction which eventually causes a wire to open. Again, because of the use of narrow linewidths, this type of failure is more likely in high density chips. If a fault can be precisely located, then there are a wide variety of well-established powerful analysis techniques that can be used to fully characterize the fault. For example, high-resolution transmission electron microscopy (TEM) can be used to analyze the presence of interfacial layers, detect regions of poor coverage, or determine material structure and composition.

Because of the seriousness of the problem, many techniques have been developed for precisely locating electrical faults. Some of these techniques are quite sophisticated, but only work for certain specific types of failures. For example, CCD cameras have been used to look through silicon chips and image photons emitted by working transistors, so that one can tell which transistors are operating. Unfortunately, a break in a wiring layer is not expected to emit photons, so that this technique is of little use in locating opens. Other techniques are quite well-known and widely used, but have serious limitations. For example, micro-probes can be used to measure the voltage along a line until the open is found. A more sophisticated version of this approach is to use voltage contrast electron microscopy to detect voltage and ground levels on wires and contacts. However, such techniques will not work if a line lies under other wires or is buried under a thick insulating layer. Worse yet, many manufacturers now use face-down surface mounting, known as flip-chip bonding, to attach chips to a carrier. With such an arrangement the wiring on a chip is buried under 100 microns ($\mu$m) or more of silicon, and is inaccessible to techniques such as atomic-force microscopy, scanning electric field microscopy, or scanning tunneling microscopy which rely on contact or near-contact.

Considered from a broader perspective, the end of an open line produces few signatures which can be used to reveal its location. Since an open generally has a very high resistance, only a small or negligible current will pass through the fault and generally there will be little heating. Thus, although infrared imaging has been used to look through chips to find short circuits, it generally does not work for high-resistance opens. Similarly, a fairly exotic technique such as superconducting quantum interference device (SQUID) -based magnetic microscopy also fails because it depends on current flow. Imaging using SQUID technology is discussed in U.S. Pat. No. 5,894,220, "Apparatus for Microscopic Imaging of Electrical and Magnetic Properties of Room Temperature Objects," Wellstood et al., incorporated by reference herein in its entirety.

Other techniques will work in general, but are quite time consuming or destructive. For example, a focused ion beam can be used to drill through layers to allow access for a microprobe or scanning electron microscope (SEM) which can then measure voltage. If the location of the fault were precisely known, this would be a straight-forward technique. However, if the job is to find the precise location of a fault, then quite a few test holes might be needed. An alternative is to simply polish away everything, all the way down to the wiring layer. Clearly this is quite destructive and would not generally work because it would destroy other connections in the chip.

Hence there is a need for a system and method for detecting opens in chips, multi-chip modules and similar devices, where the process is non-destructive, practical, and efficient.

SUMMARY OF THE INVENTION

The invention described herein is a system, method, and computer program product for scanning objects such as computer chips. The invention uses a near-field scanning Single Electron Transistor (SET) to detect features of the object. In particular, the SET detects variations in an electric field surrounding or emanating from the object. The variation in the field may be associated with an irregularity in the object, such as an open in the circuitry of a chip. In the case of a chip or a multi-chip module, a voltage is applied to the line containing the suspected open. If an actual open is present, the open will be manifested in an irregularity in the electric field associated with the line. The SET detects the irregularity in the field. For the SET to operate, a sufficiently cold operating temperature is maintained for the SET. A very low (cryogenic) temperature allows the use of a larger, more sensitive SET. Scanning SETs are known in the literature, but in such systems the object to be scanned must also be at cryogenic temperatures. In the invention described herein, the object to be scanned can be left at a temperature in its normal environmental temperature range. This temperature range is referred to hereinafter as the ambient temperature range of the object. A chip, for example, typically operates in an ambient temperature range that includes room temperature. Data from the SET indicating irregularity in the electric field can be used to derive readout data, which can in turn be used to produce an image of the object scanned.

Features and Advantages

The invention described herein has the feature of being able to detect very weak variations in an electric field using an SET. The invention has the additional feature of being able to produce an image of an object based on the electric field surrounding or emanating from the object.

The invention has the advantage of performing imaging of an object that is kept at its ambient temperature range and that need not be cryogenically cooled. The invention has the further advantage of performing imaging nondestructively.

BRIEF DESCRIPTION OF THE FIGURES

The foregoing and other features and advantages of the invention will be apparent from the following, more particular description of a preferred embodiment of the invention, as illustrated in the accompanying drawings.

DETAILED DESCRIPTION OF THE PREFERRED EMBODIMENTS

A preferred embodiment of the present invention is now described with reference to the figures where like reference numbers indicate identical or functionally similar elements. Also in the figures, the left most digit of each reference number corresponds to the figure in which the reference number is first used. While specific configurations and arrangements are discussed, it should be understood that this is done for illustrative purposes only. A person skilled in the relevant art will recognize that other configurations and arrangements can be used without departing from the spirit and scope of the invention. It will be apparent to a person skilled in the relevant art that this invention can also be employed in a variety of other devices and applications.

Contents
 I. Overview
 II. Apparatus
   A. Structure of SETs
   B. Feedback loop
   C. Cryogenic design of the system
   D. Noise and shielding
   E. Estimated signal to noise ratio
   F. Alternative embodiments
 III. Method
 IV. Computing environment
 V. Applications of the invention
 VI. Conclusion I. Overview The invention described herein is a system, method, and computer program product for imaging objects such as computer chips. The invention uses a near-field scanning Single Electron Transistor (SET). Components of the invention include:

(1) A Single Electron Transistor or SET: a very small detector that is extremely sensitive to electric fields. The SET is mounted on the end of a member, referred to as a cold finger, maintained at an operating temperature below room temperature.

(2) A cryogenic system: a mechanism which maintains the SET at the necessary operating temperature while an object (such as a chip) is scanned.

(3) A computer: used for collecting data, and generating and displaying images of the scanned object.

(4) A software package: for execution on the computer.

Figure 1:
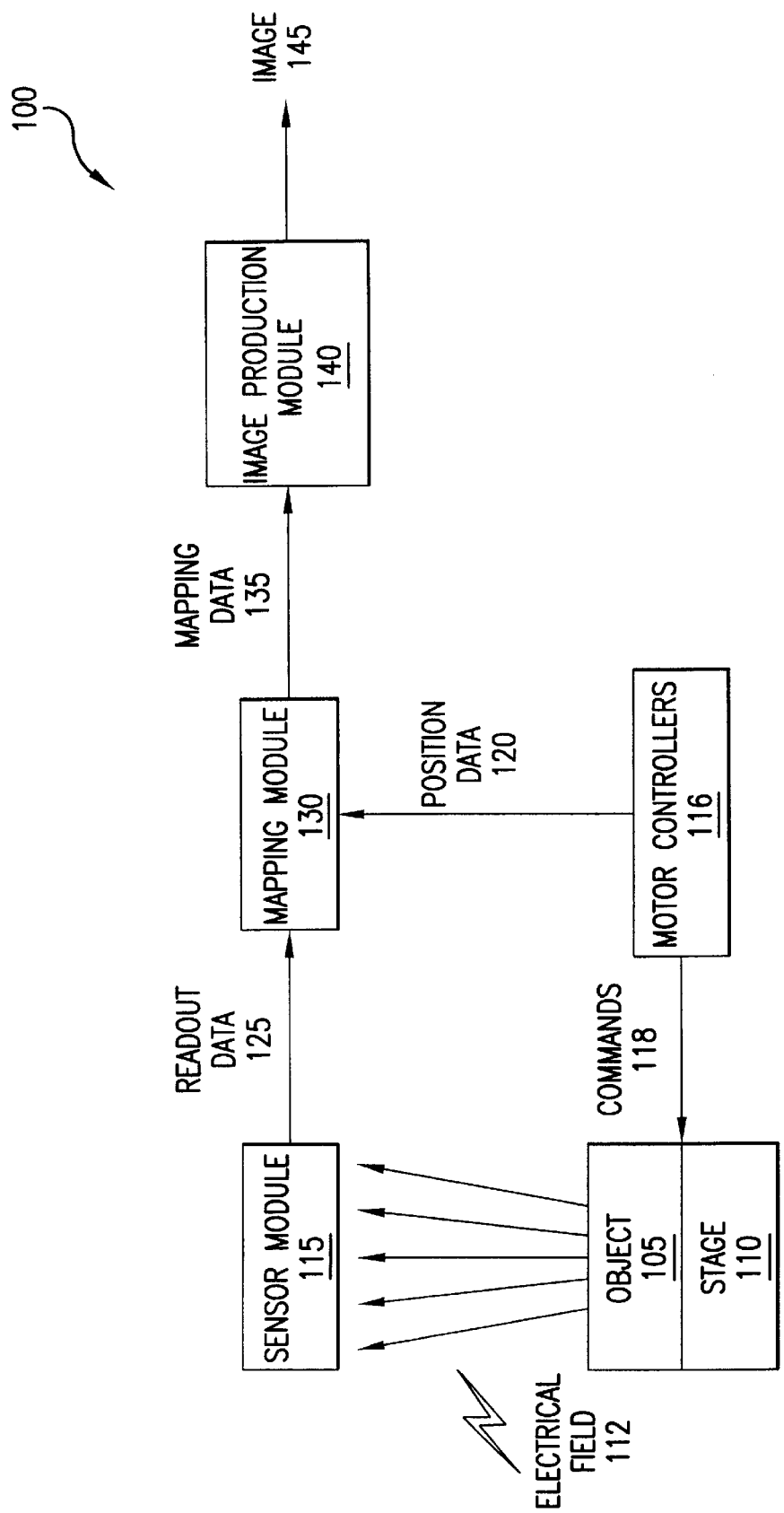
FIG. 1 is a block diagram showing the general structure and functionality of an embodiment of the invention.

FIG. 1 is a block diagram of the system of the invention. An ambient temperature sample 105 is fixed to a stage 110. The sample 105 can generate or be surrounded by an electrical field 112. If, for example, sample 105 is a chip, application of voltage to a conductor on the chip will create electrical field 112. Field 112 is detected by a sensor module 115, which contains an SET, a cryogenic apparatus to maintain the temperature of the SET, and support circuitry to facilitate detection and measurement of field 112. One or more motor controllers 116 control the position of stage 110 (and, therefore, the position of sample 105) by sending commands 118 to stage 110. Repositioning stage 110 allows the sensor module 115 to measure the field 112 at various points. In an embodiment of the invention, sensor module 115 is stationary while the ambient temperature sample 105 is scanned. The position of sample 105 at each measurement of field 112 is sent in the form of position data 120 to a mapping module 130. In an alternative embodiment, sample 105 is stationary while sensor module 115 moves about to measure field 112 at various points. In this case, data describing the position of sensor module 115 at each measurement of field 112 is sent to mapping module 130. As will be described in greater detail below, mapping module 130 can be implemented as software executing on a computer.

Sensor module 115 converts its measurements of electrical field 112 into readout data 125 and sends this data to mapping module 130. Mapping module 130 then maps the measurements of electrical field 112 to position data 120. This associates each field measurement with the point of sample 105 at which the measurement was taken. The mapping of field measurements and sample positions is then sent, in the form of mapping data 135, to an image production module 140. Image production module 140 then produces an image 145 of the sample 105 on the basis of mapping data 135. As will be described below, image production module 140 can be implemented in software executing on a computer.

Note that in an embodiment of the invention, the cryogenics of sensor module 115 operate in the 3 to 10 kelvin (K) temperature range, instead of 77 K as used in some SQUID microscope technology. Alternatively, the cryogenics of sensor module 115 operate in the 4.2 to 10 K temperature range. The lower temperature ranges of the present invention allows the use of SETs which are larger, more easily fabricated, and have lower noise. The larger size produces a larger coupling area, and thus allows more signal in the SET.

In another embodiment, sensor module 115 is cooled to temperatures below 3 K, reducing noise and increasing sensitivity by allowing the use of larger SETs.

In alternative embodiments, SETs operate at 10 K and higher. For example, at 77 K and higher, SETs are smaller and are thus much less sensitive.

II Apparatus

Figure 2:
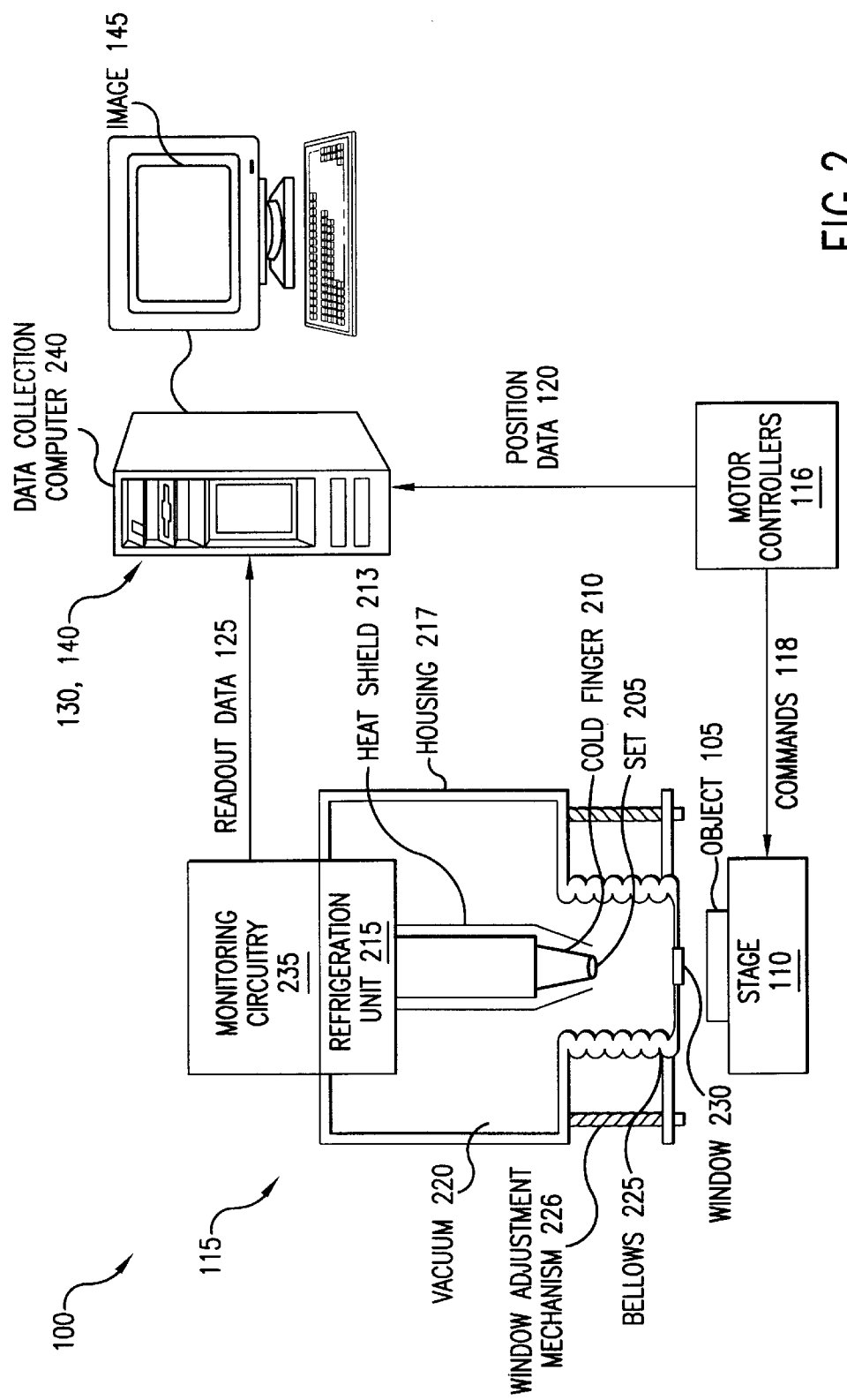
FIG. 2 illustrates the structure of an embodiment of the sensor module in greater detail.

The apparatus of an embodiment of the invention is illustrated in greater detail in FIG. 2. Sensor module 115 includes an SET 205 attached to the end of an extended member, cold finger 210. Cold finger 210 is maintained at a temperature in the 4.2 to 10 K range. Alternatively, cold finger 210 can be maintained in the temperature range of 3 to 10 K. This operating temperature is maintained by a cryogenic unit 215. Refrigeration units capable of maintaining such temperatures are commercially available. A heat shield 213 prevents thermal radiation from room temperature surroundings from thermally loading cold finger 210. SET 205 and cold finger 210 are positioned in a housing 217. Housing 217 maintains a vacuum 220, within which SET 205 operates. Housing 217 also includes an adjustable bellows section 225 within which SET 205 and cold finger 210 are disposed. At the end of bellows 225 is a thin window 230 through which SET 205 senses the electrical field of sample 105. Window 230 is made of a rigid non-conducting material. It is also desirable for the window material to be transparent, to facilitate positioning of the object 105 relative to SET 205. In an embodiment of the invention, window 230 is made of 25 μm thick sapphire and has a diameter of about 1 mm. Diamond or silicon nitride can also be used as the window material. The small diameter keeps the window from flexing too much or breaking under atmospheric pressure. A window adjustment mechanism 226 allows bellows 225 to be compressed or extended, enabling window 230 to be manipulated, so that window 230 can be brought right up to the SET 205. SET 205 can be positioned a few microns behind window 230, so that the distance between SET 205 and air is about 30 μm or less. Sample 105 can then be brought up to the outside of window 230 using stage 110.

Since SET 205 detects the electric field 112 of sample 105, imaging of electrical opens is straightforward in principle. A voltage is applied to the suspect wire of sample 105. SET 205 scans sample 105. The location of the open will show up as a change in the field 112 along the wire. Note that the open can also create a change in the local charge, dielectric constant, and voltage on the object at the location of the open. SET 205 produces an output reflecting the change in field 112. Sensor module 115 includes monitoring circuitry 235, which is connected electrically to the output of SET 205. Monitoring circuitry 235 supplies readout data 125 based on the output of SET 205.

In the embodiment of FIG. 2, readout data 125 is sent to a data collection computer 240. Data collection computer 240 includes both mapping module 130 and image creation module 140. Data collection computer 240 also receives position data 120 from motor controllers 116. Position data 120 corresponds to the position of sample 105, as determined by the position of stage 110. The position of stage 110 is in turn determined by commands 118 sent to stage 110 from motor controllers 116. Stage 110 can be a conventional x-y-z translation stage, as in an optical microscope with a motorized x-y-z translation stage. Position data 120 and readout data 125 are used by data collection computer 240 to produce an image 145 of sample 105.

A. Structure of SETs

Figure 3B:
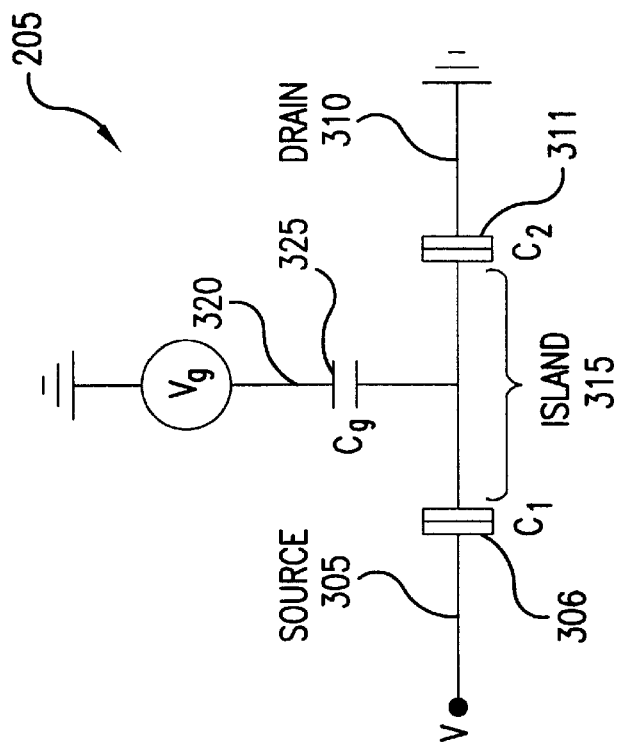
FIG. 3B is a schematic diagram of an SET.
Figure 3A:
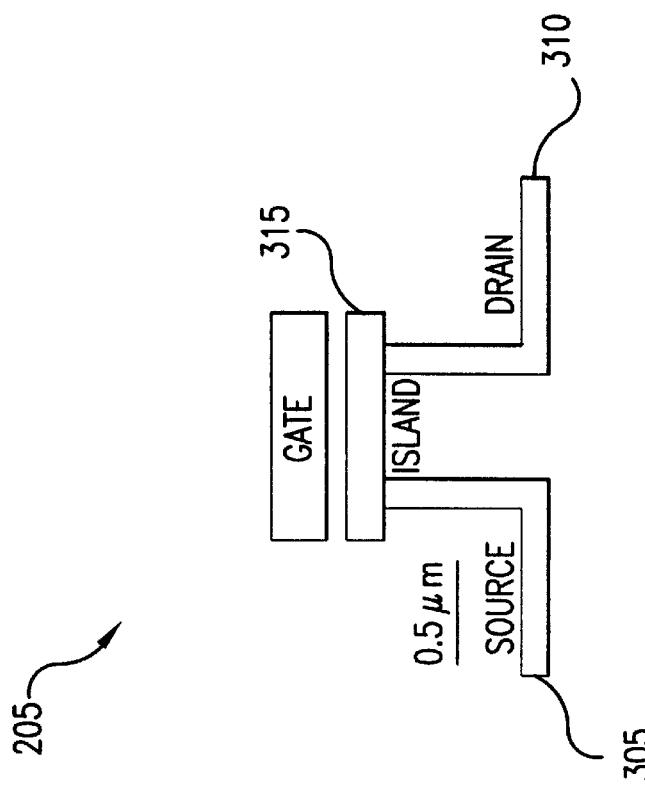
FIG. 3A is a micrograph of an SET.

The invention uses a cryogenic SET as the electric field sensor. FIGS. 3A and 3B illustrate SET 205 in greater detail. FIG. 3A is a micrograph of SET 205, while FIG. 3B is a schematic of SET 205. SET 205 includes two leads, a source lead 305 and a drain lead 310. SET 205 also contains a small metal island 315 which is coupled to the two leads 305 and 310 through high-resistance, low-capacitance tunnel junctions 306 and 311, respectively. SET 205 also includes a third lead 320 attached to a gate 325 which couples capacitively to the island 315. Applying a voltage V across SET 205 can cause a current to flow through the island, with the magnitude of the current being controlled by voltage $V_g$ applied to gate 325, much as in a field effect transistor (FET).

SET 205 works because of the Coulomb blockade: adding an electron to island 315 when gate voltage $V_g=0$, raises the energy of SET 305 by $e^2/2\ C_\Sigma$. Here $C_\Sigma=C_1+C_2+C_g+C_O$ is the total capacitance of the island 315. $C_1$ and $C_2$ are the capacitances of the two tunnel junctions 306 and 311, and $C_g$ is the gate-to-island capacitance 325 between gate 320 and island 315. $C_O$ is the capacitance of island 315 to everything other than the leads 305 and 310 and gate 320. When $V_g=0$, the energy barrier $e^2/2\ C_\Sigma$ must be overcome before a current can flow from lead 305 through the island 315 to lead 310. In conventional use, gate 320 of SET 205 serves as the input lead. If a small voltage is applied to gate 320, a polarization charge will be induced on island 315. The energy barrier is consequently lowered, and the current through island 315 increases at fixed bias voltage V. The resulting I-$V_g$ characteristic is periodic with period $e/C_g$, where e is the charge of a single electron. Once the gate-induced charge $C_g V_g$ exceeds e, the average number of electrons on island 315 will increase by one via tunneling through one of the junctions. SET devices are very sensitive to voltage or, equivalently, to induced charge $Q_O=C_g V_g$, with charge sensitivities as low as $10^{-5}\ e/Hz^{1/2}$ reported. It is this extreme sensitivity to induced charge that makes the SET such a useful sensor.

The major operating constraint on SET 205 is that it must either be very small or operated at very low temperatures. Theory predicts significant sensitivity only if the temperature $T<<e^2/2\ k_b C_\Sigma$. This is plausible since it implies that thermal fluctuations $k_b T$ must be much less than the Coulomb blockade energy $e^2/2\ C_\Sigma$. Thus a device operating at approximately room temperature must have $C_\Sigma<<3$ aF, while one working at 10 K must have $C_\Sigma<<90$ aF. Although devices have been reported which operate at liquid nitrogen and in the range of room temperature, such devices sacrifice sensitivity for higher operating temperature. For imaging of objects such as chips, where a high level of sensitivity is needed, this is a poor trade-off.

The micrograph of FIG. 3A shows an Al—Al$_2$O$_3$—Al SET which was built using electron-beam lithography and a conventional double-angle evaporation technique. While the island on this device is about 2 μm long and 0.2 μm wide, smaller devices, such as those with center island about 0.5 μm long and 0.1 μm wide, can be used. The junction overlap area can be as small as 10 nm×10 um, giving $C_\Sigma\approx120$ aF. Devices with this capacitance can operate up to about 6 K. For near-field microscopy, the sub-micron size of the island is a significant advantage because it implies that the signal will be averaged over a very small area. On the other hand, making the island too small reduces the coupling to external electric fields, reducing the signal from an object being scanned.

B. Feedback Loop

Given the application of current to SET 205, a potential difference ΔV is created across SET 205. ΔV, however, does not vary linearly with the voltage $V_g$ applied to island 315. Because of this, it becomes necessary to create readout data 125 that corresponds in a linear manner to $V_g$. In an embodiment of the invention, the creation of readout data 125 is accomplished by a feedback loop 400, illustrated in FIG. 4.

A current source 405 is applied across an SET consisting of source lead 305, drain lead 310, and island 315. This results in a voltage ΔV 410 across the SET. An amplifier 415 accepts ΔV 410 and sends an output to a mixer 420. The reference 430 for mixer 420 is supplied by an oscillator 425. The output of mixer 420 is sent to integrator 435, which performs time averaging. The resulting signal is passed to an adder 440. Adder 440 combines the output of integrator 435 with the signal supplied by oscillator 425. The result is a feedback voltage which is sent to island 315. In general, the feedback loop 400 operates so that this feedback voltage compensates for the electric field 112 from the scanned object 105. Island 315 therefore receives both the output from adder 440 and the voltage induced by scanning object 105.

The output of integrator 435 is used to develop readout data 125. A lock-in 445 accepts the output of integrator 435, along with the output of an oscillator 450. The output of lock-in 445 is readout data 125, taken from a readout point 447. Readout data 125 is then passed to data collection computer 240. The output of oscillator 450 is also fed into sample 105, and serves as the voltage applied across the suspected open. In one embodiment, oscillator 450 operates at approximately 1 kHz. This serves to minimize the effects of environmental noise, as will be discussed below.

C. Cryogenic Design of the System

In order to use an SET to take a near-field scan of an ambient temperature sample, an apparatus must be constructed which keeps the sensor, i.e., the SET, cold. This is particularly problematic because the sensor and ambient temperature sample need to be very close to each other and the sample is in air. Referring to FIG. 2, the problem is addressed by the placement of SET 205 behind the window 230. SET 205 can be positioned a few microns behind window 230, so that the distance between SET 205 and air is about 30 μm or less. Sample 105 can then be brought up to the outside of window 230 using stage 110.

There are presently several commercial refrigerators available which can meet the cooling requirements of the invention. A microscope that cools the sensor with a cryogenic device can be relatively compact, relatively easy and inexpensive to operate, and easy to commercialize. The disadvantage of such a system is the expense and the possibility of vibration. Vibrational noise is insignificant on the present 77 K Joule-Thomson cryogenic refrigerators. The two-stage Giffard-McMahon and pulse-tube systems that can be used down to about 4.2 K will have substantially more vibration, but a flexible cold-link can be used to minimize the vibration at SET 205. Although vibration is less significant in the Joule-Thomson systems, a flexible cold-link can nonetheless be helpful in order to minimize problems with thermal expansion. Also, heat shield 113 keeps the thermal loading from room-temperature radiation to a minimum.

D. Noise and Shielding

Figure 4:
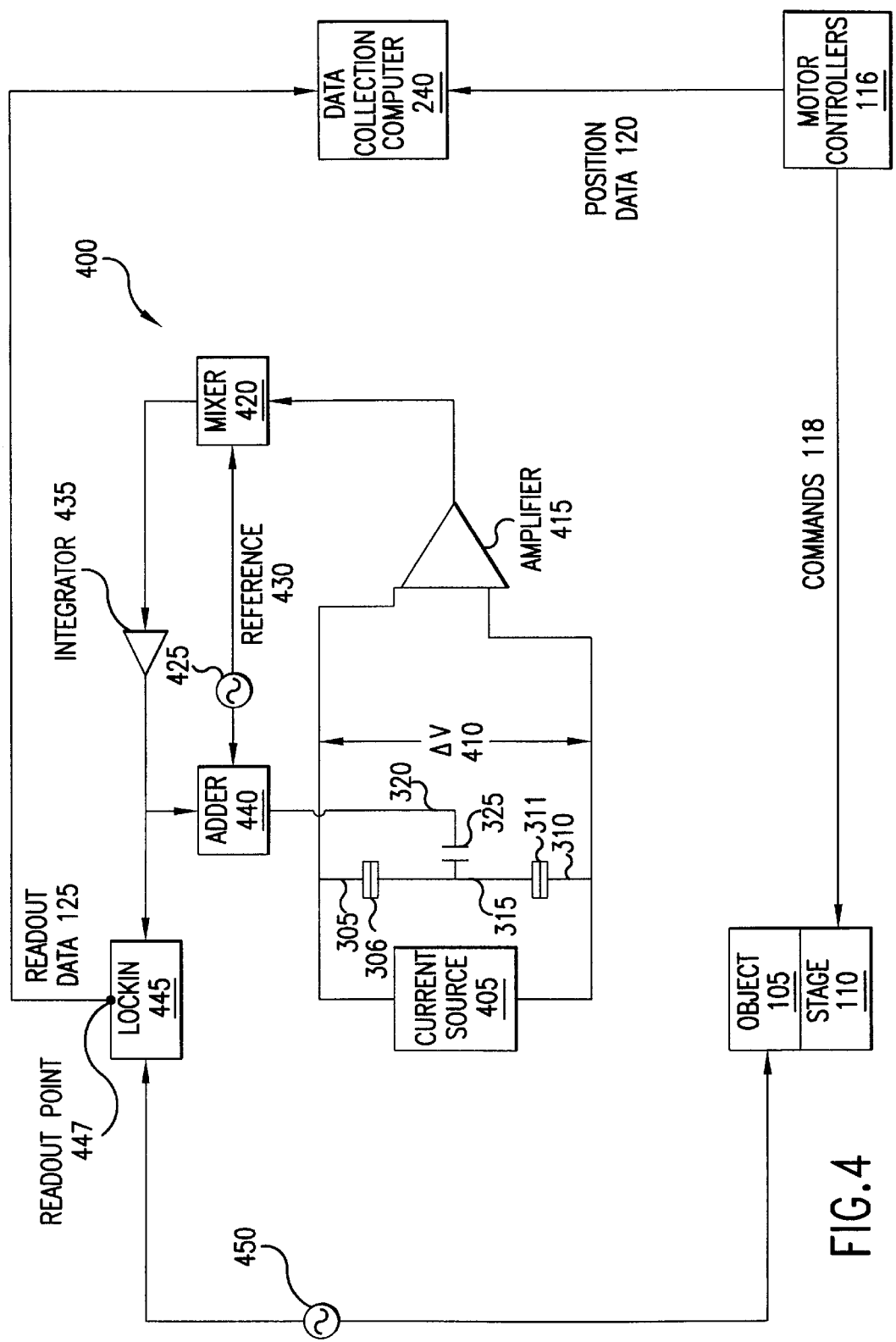
FIG. 4 is a schematic diagram of a feedback loop used to generate readout data, according to an embodiment of the invention.

Locating an open on a chip can be done by applying an alternating current (ac) voltage to a suspected open line and scanning the chip using the invention. As illustrated in FIG. 4, a voltage at a few kHz can be supplied by an oscillator 450 and used to minimize the effects of low-frequency drift and radio frequency (rf) noise. This also allows the use of a lock-in 445 to improve the signal-to-noise ratio and minimize the influence of background charging, external electric field disturbances, and vibrations.

Another important consideration in the design of the system is the need for adequate shielding from external interference. Due to their non-linear response and the small output current levels, SETs are extremely sensitive to high-frequency interference; rf interference is rectified and causes a reduction in the response of an SET to static electric fields. While using SETs, it can be useful to protect against interference. Protective measures can include operation in a quiet laboratory, use of an rf shielded room, use of a shield enclosure around the SET, and extensive use of ambient temperature and cryogenic microwave and rf filters on all the leads.

E. Estimated Signal to Noise Ratio

The main advantage that an SET microscope has over other schemes is the extreme field sensitivity of the sensor, i.e., the SET. The voltages on control wires in a multi-chip module, for example, produce extremely weak electric fields at the surface of the module. Although the fields are extremely weak, they can be readily detected by an SET because of its extreme sensitivity.

To estimate the size of the signal one expects, consider a small length L of an infinitely long wire which is held at a voltage V. At a distance r from the wire, the small section will generate a normal component of electric field $E_z$ of about:

$$E_z \approx \frac{q}{4\pi\varepsilon_o r^2} \quad [1]$$

where q is the charge on the section of wire caused by the applied voltage V. Of course a very long wire (L>>r) will generate a larger field which will fall off as 1/r, but for imaging purposes, the resolution of small features is desirable, and it is more meaningful to consider the field produced just by a small section. For a 50Ω impedance wire in a vacuum, the capacitance per unit length is expected to be about $C/L \approx 60$ pF/m. The charge q can be expressed as:

$$q = L(C/L)V. \quad [2]$$

From Gauss's law, the amount of charge $Q_O$ which will be induced on an SET island of area A is approximately $$Q_o \approx \varepsilon_o E_z A \approx \frac{L(C/L)AV}{4\pi r^2}. \quad [3]$$

Considering an L=10 μm section of the wire, taking the SET island area as 0.5 μm×0.5 μm, setting V=10V, and assuming that we are r≈300 μm from the wire, from Eq. [3], one finds $Q_O \approx 0.08$ e.

This signal needs to be compared to the noise in the SET. At a frequency of about 1 kHz, a charge sensitivity of about $3 \times 10^{-4}$ e/Hz$^{1/2}$ at 4.2° K is achievable. By using a lock-in detector with a 1 second time-constant to extract the signal at 1 kHz, noise of about $3 \times 10^{-4}$ e can be expected. A signal to noise power ratio of about $7 \times 10^4$ per pixel can therefore be expected.

The estimates for the signal are approximations. The field will be enhanced by the presence of the metal SET island, which is effectively grounded, and reduced because the wires to the SET will also absorb some field lines. The precise signal level will depend on the geometry of the SET and its leads, as well as the geometry of the sample.

Another advantage of the SET system is that by using Maxwell's equations, the electric field images can be converted into direct images of the voltage levels on the chip, local charges, or dielectric constants. In this way, a user can map out the location of wires in the chip and find the point where a break occurs.

A secondary consequence of this mathematical conversion is that the resulting voltage images can be sharper than the original electric field images. In most scanning near-field microscopes, the spatial resolution is limited by the distance between the sample and the sensor. In an SET microscope, the standard near-field limit can be improved upon by a large factor because of the high signal-to-noise ratio in the SET and the known mathematical relationship between electric fields and voltage. As a result, fine details in the wiring can be resolved, even if wiring layers are buried in a module or hidden under a chip.

F. Alternative Embodiments of the Invention

The apparatus of the invention can be embodied in forms other than what has been described above. Alternative embodiments include but are not limited to the following:

(1) The object being scanned can be held stationary while the SET is moved about to measure the electrical field at various points around the object.

(2) The SET could operate at a different temperature, say in the 70–80 K range using a Joule-Thomsen refrigerator as in existing SQUID microscopes. As discussed above, however, a temperature in this range implies a smaller, less sensitive SET.

(3) The SET could operate at a lower temperature (0.3 K to 3 K) with a helium 3 refrigerator or from 0.01 K to 4 K with a dilution refrigerator. This would improve the sensitivity and the available coupling area.

(4) The SET could be mounted on the end of a liquid helium dewar or a cryo-cooler to provide the necessary cryogenic environment.

(5) The SET island could be coupled to a pickup electrode or antenna to improve the electric field pickup. The antenna could be a long wire-like structure or pad which intercepts electric field lines and concentrates the resulting induced charge near the island. This would allow for an increase in signal without degradation of the SET island characteristics due to increased device capacitance. For example, the antenna could protrude through the thin window, allowing it to be brought out into the air and in very close proximity to the surface of an object. On the vacuum side of the window, the other end of the antenna could be coupled to the SET by placing the SET in close proximity to the end of the antenna.

Figure 5:
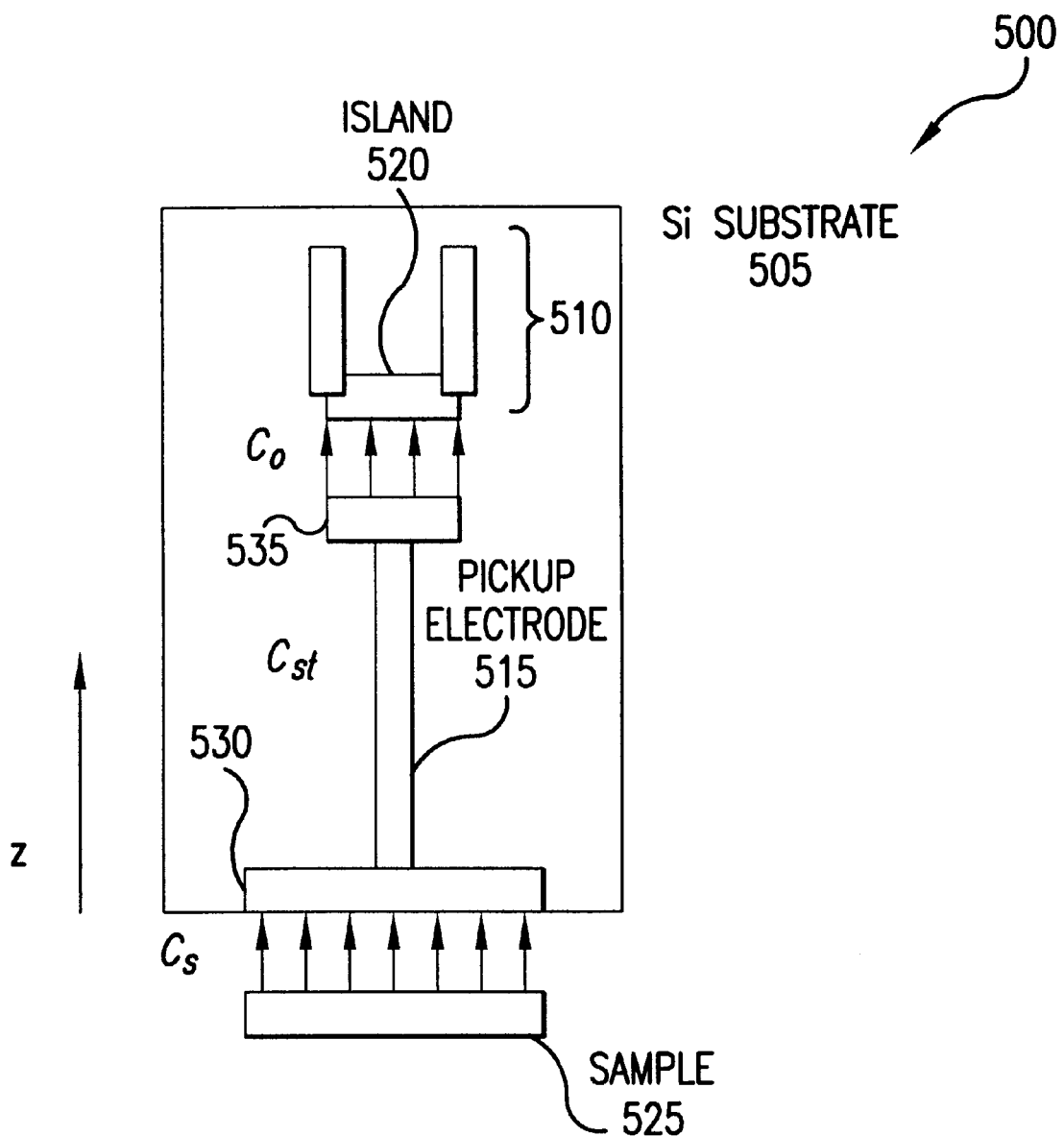
FIG. 5 illustrates the use of an pickup electrode to improve the performance of an SET.

An alternative example is illustrated in FIG. 5. By mounting the substrate 505 of an SET 510 vertically, and placing a pickup electrode 515 between the SET island 520 and an object 525, one can show that the change in the island charge $\delta Q_O$ caused by a changing voltage signal $\delta V_s$ applied to the object equals:

$$\delta Q_o = \frac{C_0 C_s}{C_o + C_s + C_{st}} \delta V_s \quad [4]$$

where $C_s$ is the capacitance between the pickup electrode 515 and the object 525, $C_o$ is the capacitance between the pickup electrode 515 and the island 520, and $C_{st}$ is the stray capacitance between the pickup electrode 515 and everything else besides the object 525 and the island 520.

By making the bottom 530 of pickup electrode 515 large, the capacitance $C_s$ can be made much larger than $C_{st}$ and $C_o$ and, consequently, equation (4) can be written as $\delta Q_o = C_o \delta V_s$. The coupling between the top 535 of the pickup electrode 515 and the island 520 can be controlled by e-beam lithography and made to equal about 10 aF, for instance, without significantly impairing the performance of the SET 510 at 4 K. If a 1 kHz ac voltage signal is applied to the object with an amplitude of 1 V, the corresponding change in the island charge will equal about 60 e. This is $2 \times 10^5$ times greater than the noise in the SET 510 at 4 K and with a measurement bandwidth of 1 Hz.

III Method

Figure 6:
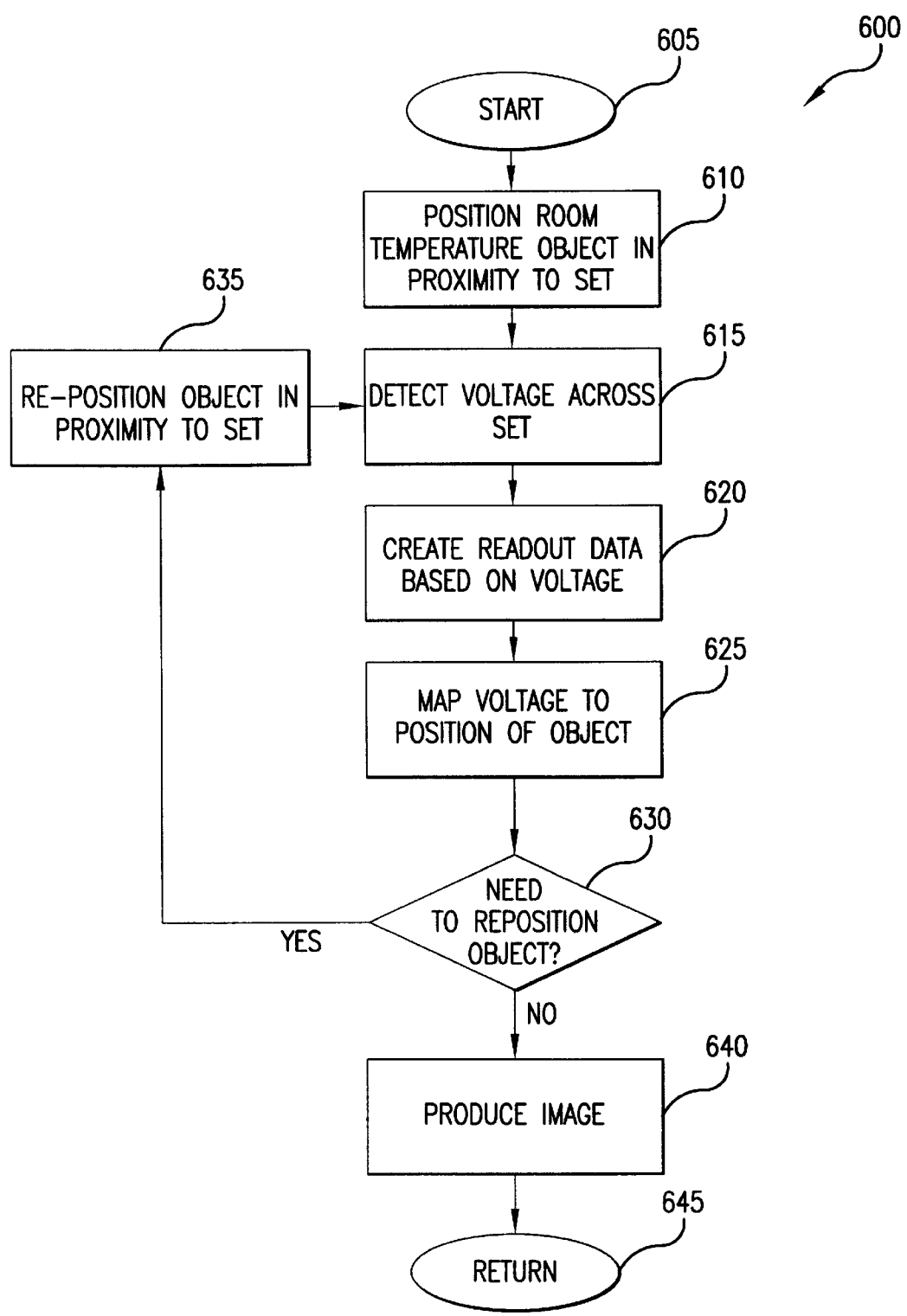
FIG. 6 illustrates a method of the invention.

The method of the invention is illustrated by flowchart 600 of FIG. 6. The method begins with a step 605. In a step 610, an ambient temperature object to be scanned is placed in proximity to a cryogenically cooled SET. In a step 615, the voltage across the SET is detected. In a step 620, readout data is produced, based on the voltage detected in step 615. In a step 625, the detected voltage is mapped to the position of the object. This is equivalent to mapping the detected voltage to that point of the object at which the electric field is being sensed. In a step 630, a determination is made as to whether the object needs to be repositioned for scanning another point of the object. If so, then the object is repositioned in a step 635, and the process continues at step 615. If the object does not need to be repositioned, then the process continues at a step 640. At step 640, an image is produced based on the successive mappings of step 625. The process concludes with a step 645.

IV. Computing Environment

Figure 7:
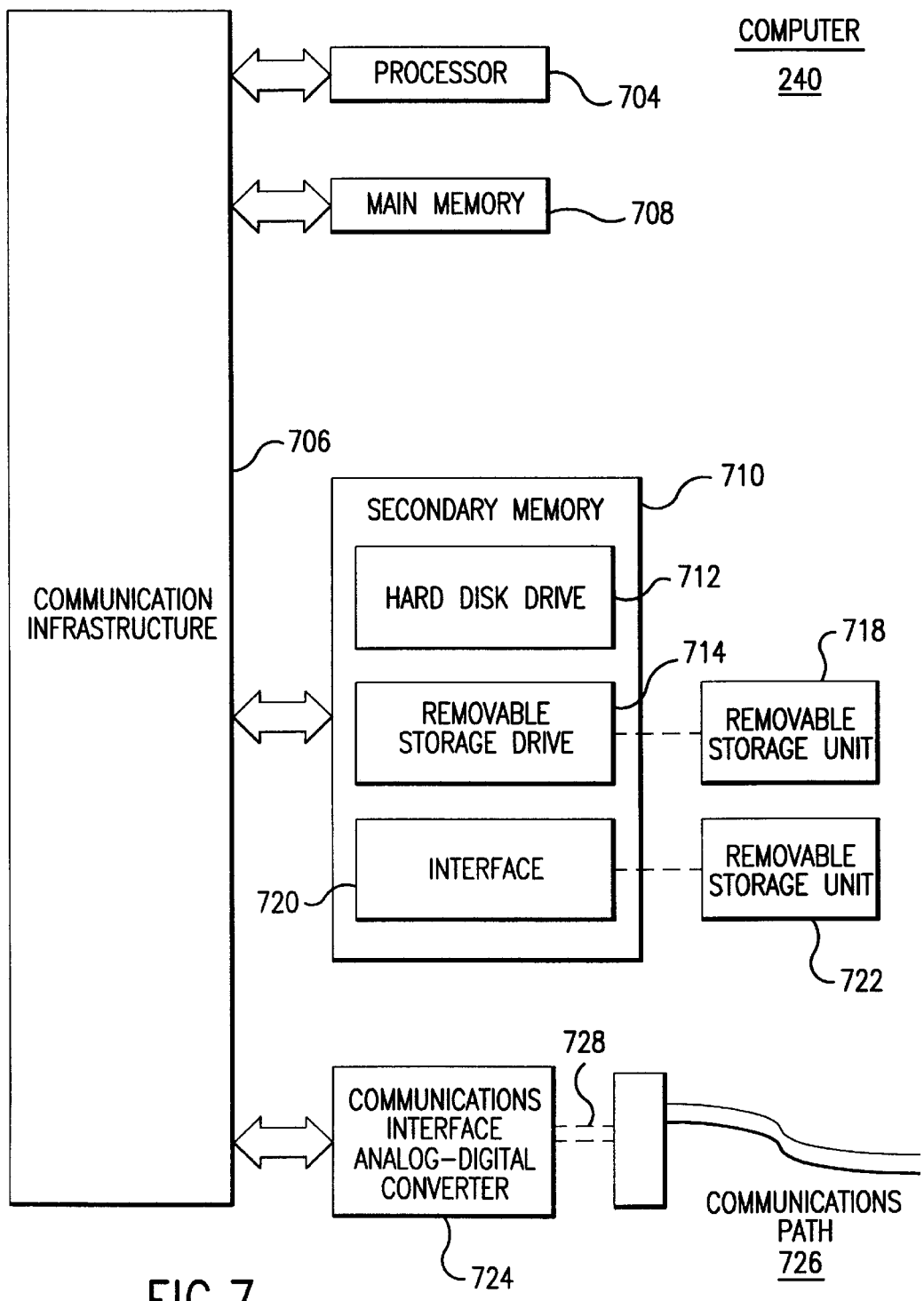
FIG. 7 illustrates an example computing environment for the invention.

The data collection, mapping, and image production operations of the present invention may be implemented in a computer 240 or other processing system. An example of a computer 240 is shown in FIG. 7. The computer 240 includes one or more processors, such as processor 704. The processor 704 is connected to a communication infrastructure 706, such as a bus or network. Various software implementations are described in terms of this exemplary computer system. After reading this description, it will become apparent to a person skilled in the relevant art how to implement the invention using other computer systems and/or computer architectures.

Computer 240 also includes a main memory 708, preferably random access memory (RAM), and may also include a secondary memory 710. The secondary memory 710 may include, for example, a hard disk drive 712 and/or a removable storage drive 714, representing a floppy disk drive, a magnetic tape drive, an optical disk drive, etc. The removable storage drive 714 reads from and/or writes to a removable storage unit 718 in a well known manner. Removable storage unit 718, represents a floppy disk, magnetic tape, optical disk, or other storage medium which is read by and written to by removable storage drive 714. As will be appreciated, the removable storage unit 718 includes a computer usable storage medium having stored therein computer software and/or data.

In alternative implementations, secondary memory 710 may include other means for allowing computer programs or other instructions to be loaded into computer 240. Such means may include, for example, a removable storage unit 722 and an interface 720. Examples of such means may include a program cartridge and cartridge interface (such as that found in video game devices), a removable memory chip (such as an EPROM, or PROM) and associated socket, and other removable storage units 722 and interfaces 720 which allow software and data to be transferred from the removable storage unit 722 to computer 240.

Computer 240 can also have a communications interface 724, which may include an analog to digital converter. Communications interface 724 allows software and data to be transferred between computer 240 and external devices. Examples of communications interface 724 may include a modem, a network interface (such as an Ethernet card), a communications port, a PCMCIA slot and card, etc. Software and data transferred via communications interface 724 are in the form of signals 728 which may be electronic, electromagnetic, optical or other signals capable of being received by communications interface 724. These signals 728 are provided to communications interface 724 via a communications path (i.e., channel) 726. This channel 726 carries signals 728 and may be implemented using wire or cable, fiber optics, a phone line, a cellular phone link, an RF link and other communications channels. Signals 728 sent to computer 240 via channel 726 include position data 120 and readout data 125. Channel 726 can also carry a produced image 145 to an output device.

In this document, the terms "computer program medium" and "computer usable medium" are used to generally refer to media such as removable storage units 718 and 722, a hard disk installed in hard disk drive 712, and signals 728. These computer program products are means for providing software to computer 240.

Computer programs (also called computer control logic) are stored in main memory 708 and/or secondary memory 710. Computer programs may also be received via communications interface 724. Such computer programs, when executed, enable the computer 240 to implement the present invention as discussed herein. In particular, the computer programs, when executed, enable the processor 704 to implement the present invention. Accordingly, such computer programs represent controllers of the computer 240. Where the invention is implemented using software, the software may be stored in a computer program product and loaded into computer 240 using removable storage drive 714, hard drive 712 or communications interface 724. Software for mapping readout data to SET positions and for image production can therefore be loaded into computer 240 through any of these means.

V. Applications of the Invention

Apart from scanning a chip or module for opens, the invention can have a variety of other applications. These applications all allow detection, using an SET, of an electrical field associated with an ambient temperature object. One application of the invention is direct determination of the location of open-circuit wiring faults in multi-chip modules, chip mounts, microelectronics, computer chips and flip-chip microelectronic circuits. The invention may also be useful as a general purpose measuring instrument in solid state and materials research for analyzing the dielectric properties of dielectrics, piezoelectric and ferroelectric materials. The invention might also be useful for doing reverse engineering on chips, for making noncontact electrical measurements on functioning systems, or for developing novel security verification systems.

The invention might also be useful for looking at neurological signals in biological systems. The invention might be used to detect chemical reactions which cause the corrosion of metal, by detecting the voltages which are produced in such reactions.

In general, the device could also be used to detect different components of the electric field vector E.

VI. Conclusion

While various embodiments of the present invention have been described above, it should be understood that they have been presented by way of example, and not limitation. It will be apparent to persons skilled in the relevant art that various changes in detail can be made therein without departing from the spirit and scope of the invention. Thus the present invention should not be limited by any of the above-described exemplary embodiments, but should be defined only in accordance with the following claims and their equivalents.

What is claimed is:

1. A method for sensing variations in an electric field emanating from an object under study, comprising the steps of:

enveloping a single electron transistor into a cryogenic housing and maintaining said single electron transistor at a cryogenic temperature;

positioning an object under study externally of said cryogenic housing and maintaining said object under study at an ambient temperature;

aligning said single electron transistor and a specific area of said object under study, said single electron transistor sensing electrical field emanating from said object under study and generating an output signal corresponding to the strength of said electrical field;

creating read-out data corresponding to said output signal; and mapping said read-out data in correlation to coordinates of said specific area of said object under study.

2. The method of claim 1, wherein said single electron transistor includes a metal island, a source, a drain, and a gate, said method further comprising the steps of:

coupling a feed-back loop to said single electron transistor; and creating said read-out data by means of said feed-back loop in a linear manner with respect to a voltage on said gate of said single electron transistor.

3. The method of claim 1, further comprising the steps of:

varying relative disposition between said single electron transistor and said object under study, creating a plurality of said read-out data corresponding to said output signals acquired at a plurality of said specific areas of said object under study, mapping said plurality of read-out data in correlation to coordinates of said plurality of said specific areas of said object under study; and creating an image of said object under study based on said correlation.

4. A system for sensing variations in an electric field emanating from an object under study, comprising:

a single electron transistor (SET) enveloped within a cryogenic housing and maintained at a cryogenic temperature, an object under study positioned externally of said cryogenic housing and maintained substantially at an ambient temperature, said single electron transistor generating an output signal corresponding to the strength of the electric field emanating from said object under study and sensed by said single electron transistor, and mapping means for correlating read-out data corresponding to said output signal of said single electron transistor to a specific area of said object under study.

5. The system of claim 4, wherein said single electron transistor includes a metal island, a source, a drain, and a gate, said system further comprising a feed-back loop coupled to said single electron transistor to create said read-out data in a linear manner with respect to a voltage on said gate of said single electron transistor.

6. The system of claim 4, further comprising a cold finger, said single electron transistor being attached to said cold finger.

7. The system of claim 4, wherein said object under study is maintained at room temperature.

8. The system of claim 6, wherein said cold finger and said single electron transistor are maintained at approximately 4° kelvin (K).

9. The system of claim 6, wherein said cold finger and said single electron transistor are maintained at approximately 77° K.

10. The system of claim 4, wherein said cryogenic housing comprises a window, said single electron transistor sensing said electric field emanating from said object under study through said window.

11. The system of claim 10, wherein said window is transparent.

12. The system of claim 10, wherein said window is made of sapphire.

13. The system of claim 10, wherein the thickness of said window is approximately 30 µm.

14. The system of claim 4, wherein a vacuum is maintained in said cryogenic housing.

15. The system of claim 4, further comprising a stage translated along x, y and z coordinates, said object under study being secured to said stage.

16. The system of claim 4, further comprising processing means for receiving and correlating said readout data and data corresponding to the position of said specific area of said object under study.

17. The system of claim 16, wherein said processing means produce an image of said object under study.

18. The system of claim 5, further comprising a pickup electrode connected to said metal island of said single electron transistor for coupling the electric field emanating from said object under study and said metal island.

19. A computer program product comprising a computer usable medium having computer readable program code that executes on a computer for producing an image of an object under study based on electric field emanating from said object under study, the computer readable program code comprising:
 (a) first computer readable program code logic for mapping a plurality of read-out data generated by said single electron transistor to a plurality of relative dispositions of a single electron transistor enveloped in a cryogenic housing and maintained at a cryogenic temperature with respect to said object under study positioned externally of said cryogenic housing and maintained at ambient temperature,
 (b) second computer readable program code logic for producing an image of said object under study based on said mapping.

\* \* \* \* \*